United States Patent
Besser et al.

(10) Patent No.: US 6,867,428 B1
(45) Date of Patent: Mar. 15, 2005

(54) STRAINED SILICON NMOS HAVING SILICON SOURCE/DRAIN EXTENSIONS AND METHOD FOR ITS FABRICATION

(75) Inventors: Paul R. Besser, Sunnyvale, CA (US); Eric N. Paton, Morgan Hill, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/282,712

(22) Filed: Oct. 29, 2002

(51) Int. Cl.[7] ............... H01L 29/06; H01L 31/072; H01L 31/109; H01L 31/0328; H01L 31/0336
(52) U.S. Cl. ............... 257/19; 257/18; 257/20; 257/192; 257/200; 257/616
(58) Field of Search ...................... 257/12–19

(56) References Cited

U.S. PATENT DOCUMENTS

| | | |
|---|---|---|
| 6,583,000 B1 * | 6/2003 | Hsu et al. ............... 438/222 |
| 6,657,223 B1 | 12/2003 | Wang et al. |
| 2002/0123197 A1 * | 9/2002 | Fitzgerald et al. ......... 438/285 |
| 2002/0125497 A1 * | 9/2002 | Fitzgerald ............... 257/191 |
| 2003/0068883 A1 * | 4/2003 | Ajmera et al. ........... 438/664 |
| 2003/0139001 A1 * | 7/2003 | Snyder et al. ........... 438/197 |
| 2004/0061191 A1 * | 4/2004 | Paton et al. ............. 257/412 |
| 2004/0097025 A1 * | 5/2004 | Fitzgerald ............... 438/197 |

* cited by examiner

Primary Examiner—Tom Thomas
Assistant Examiner—Jesse A. Fenty
(74) Attorney, Agent, or Firm—Foley & Lardner LLP

(57) ABSTRACT

An n-type strained silicon MOSFET utilizes a strained silicon channel region formed on a silicon germanium substrate. Silicon regions are provided in the silicon geranium layer at opposing sides of the strained silicon channel region, and shallow source and drain extensions are implanted in the silicon regions. By forming the shallow source and drain extensions in silicon regions rather than in silicon germanium, source and drain extension distortions caused by the enhanced diffusion rate of arsenic in silicon germanium are avoided.

10 Claims, 5 Drawing Sheets

US 6,867,428 B1

STRAINED SILICON NMOS HAVING SILICON SOURCE/DRAIN EXTENSIONS AND METHOD FOR ITS FABRICATION

BACKGROUND OF THE INVENTION

1. Field of the Invention

The present invention relates generally to fabrication of metal oxide semiconductor field effect transistors (MOSFETs), and more particularly, to MOSFETs that achieve improved carrier mobility through the incorporation of strained silicon.

2. Related Technology

MOSFETs are a common component of integrated circuits (ICs). FIG. 1 shows a conventional MOSFET device. The MOSFET is fabricated on a semiconductor substrate 10 within an active area bounded by shallow trench isolations 12 that electrically isolate the active area of the MOSFET from other IC components fabricated on the substrate 10.

The MOSFET is comprised of a gate electrode 14 that is separated from a channel region 16 in the substrate 10 by a thin first gate insulator 18 such as silicon oxide or oxide-nitride-oxide (ONO). To minimize the resistance of the gate 14, the gate 14 is typically formed of a doped semiconductor material such as polysilicon.

The source and drain of the MOSFET are provided as deep source and drain regions 20 formed on opposing sides of the gate 14. Source and drain suicides 22 are formed on the source and drain regions 20 and are comprised of a compound comprising the substrate semiconductor material and a metal such as cobalt (Co) or nickel (Ni) to reduce contact resistance to the source and drain regions 20. The source and drain regions 20 are formed deeply enough to extend beyond the depth to which the source and drain silicides 22 are formed. The source and drain regions 20 are implanted subsequent to the formation of a spacer 30 around the gate 14 and gate insulator 18 which serves as an implantation mask to define the lateral position of the source and drain regions 20 relative to the channel region 18 beneath the gate.

The gate 14 likewise has a silicide 24 formed on its upper surface. The gate structure comprising a polysilicon material and an overlying silicide is sometimes referred to as a polycide gate.

The source and drain of the MOSFET further comprise shallow source and drain extensions 26. As dimensions of the MOSFET are reduced, short channel effects resulting from the small distance between the source and drain cause degradation of MOSFET performance. The use of shallow source and drain extensions 26 rather than deep source and drain regions near the ends of the channel 18 helps to reduce short channel effects. The shallow source and drain extensions are implanted prior to the formation of the spacer 30, and the gate 14 acts as an implantation mask to define the lateral position of the shallow source and drain extensions 26 relative to the channel region 18. Diffusion during subsequent annealing causes the source and drain extensions 26 to extend slightly beneath the gate 14.

Implanted adjacent to the shallow source and drain extensions 26 are so-called "halo" regions 28. The combination of shallow source/drain extensions and halo regions is sometimes referred to as double-implanted shallow source and drain extensions. The halo regions 28 are implanted with a dopant that is opposite in conductivity type to the dopant of the source and drain extensions 26. For example, when the source and drain extensions are implanted with an n-type dopant such as arsenic (As) or phosphorous (P), the halo regions are implanted with a p-type dopant such as boron (B). The halo regions 28 help to suppress a short channel effect known as punchthrough, which occurs when the channel length of the device is sufficiently short to allow the depletion regions at the ends of the source and drain extensions to overlap, thus effectively merging the two depletion regions. Any increase in reverse-bias drain voltage beyond that required to establish punchthrough lowers the potential energy barrier for majority carriers in the source, resulting in a punchthrough current between the source and drain that must be suppressed for proper device operation. The presence of the halo regions 28 shortens the depletion regions at the ends of the source and drain extensions 26 and thus allows the fabrication of MOSFETs having shorter channel regions while avoiding punchthrough. The halo regions 28 may be formed by low energy implantation of dopant at an angle to the substrate so as to ensure that the halo regions extend beyond the ends of the source and drain extensions 26.

One recent area of investigation for improvement of the conventional MOSFET is the incorporation of "strained" silicon in the semiconductor substrate. Strained silicon is a form of silicon in which a tensile strain is applied to the silicon lattice as a result of the difference in the dimensionalities of the silicon lattice and the lattice of the underlying material on which it is formed. In the illustrated case, the silicon germanium lattice is more widely spaced than a pure silicon lattice, with the spacing becoming wider as the percentage of germanium increases. Because the silicon lattice aligns with the larger silicon germanium lattice during formation, a tensile strain is imparted to the silicon layer. In essence, the silicon atoms are pulled apart from one another. Relaxed silicon has a conductive band that contains six equal valence bands. The application of tensile strain to the silicon causes four of the six valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons meet with less vibrational energy from the nucleus of the silicon atom, which causes them to scatter at a rate of 500 to 1000 times less than in relaxed silicon. Consequently, carrier mobility is dramatically increased in strained silicon compared to relaxed silicon, providing a potential increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

FIG. 2 shows an example of an N-type MOSFET (NMOS) incorporating strained silicon and formed in accordance with the conventional processing used to form the MOSFET of FIG. 1. The MOSFET of FIG. 2 differs from the MOSFET of FIG. 1 in that it is formed on a silicon germanium semiconductor substrate 32 over which is formed an epitaxial layer of strained silicon 34. The upper portions of the channel region 18 and the source and drain extensions 26 are formed in the strained silicon layer 34. The thickness of the strained silicon layer 34 is less than the depth of the shallow source and drain extensions 26.

The arsenic (As) dopant of the NMOS shallow source and drain extensions 26 and source and drain regions 20 diffuses at a greater rate in silicon germanium than in silicon, and as a result, during processing such as rapid thermal annealing (RTA) to activate the implanted dopants, the expansion of the shallow source and drain extensions 26 and the source and drain regions 20 is greater in the silicon germanium substrate 32 than in the strained silicon layer 34. As a result, the shallow source and drain extensions 26 develop distorted outgrowths 36 that effectively shorten the channel length in the silicon germanium layer 32 and can cause greater risk of punchthrough and other short channel effects.

Therefore the n-type strained silicon MOSFET formed in accordance with the conventional processing used to form an NMOS on a relaxed silicon substrate suffers from degraded short channel effect resistance compared to the conventional MOSFET.

SUMMARY OF THE INVENTION

It is an object of the present invention to provide the enhancements of strained silicon in an NMOS device without significantly degrading the resistance of the device to short channel effects resulting from dopant diffusion.

In accordance with embodiments of the invention, a strained silicon NMOS utilizes a strained silicon channel region formed on a silicon germanium substrate. Silicon regions are provided at opposing sides of the strained silicon channel region and shallow source and drain extensions are implanted in the silicon regions. By forming the source and drain extensions in silicon regions rather than in silicon germanium, source and drain extension distortions caused by the enhanced diffusion rate of arsenic dopant in silicon germanium are avoided.

In accordance with one embodiment of the invention, a process for forming a MOSFET produces an NMOS structure as described above. Initially a substrate is provided. The substrate includes a layer of silicon germanium having a layer of strained silicon formed thereon. The substrate further includes a gate insulator formed on the strained silicon layer and a gate formed on the gate insulator. A first spacer is then formed around the gate and gate insulator. The strained silicon layer and the silicon germanium layer are then etched to form a strained silicon channel region beneath the gate insulator and trenches on opposing sides of the channel region. Silicon regions are then formed in the trenches, and shallow source and drain extensions are implanted in the silicon regions.

In accordance with another embodiment of the invention, a MOSFET has a structure as described above. The MOSFET includes a substrate comprising a layer of silicon germanium, a strained silicon channel region formed on the layer of silicon germanium, a gate insulator formed on the strained silicon channel region, and a gate formed on the gate insulator. Silicon regions are provided in the silicon germanium layer on opposing sides of the channel region. Deep source and drain regions are formed in the silicon regions, and shallow source and drain extensions are formed in the silicon regions and extend from the source and drain regions toward the channel region.

DESCRIPTION OF THE DRAWINGS

Embodiments of the invention are described in conjunction with the following drawings, in which.

DETAILED DESCRIPTION OF PREFERRED EMBODIMENTS

Figure 1:
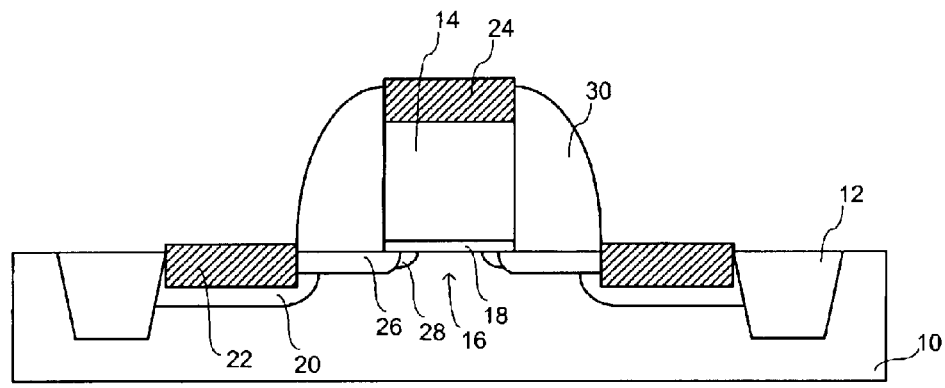
FIG. 1 shows a conventional MOSFET formed in accordance with conventional processing.
Figure 2:
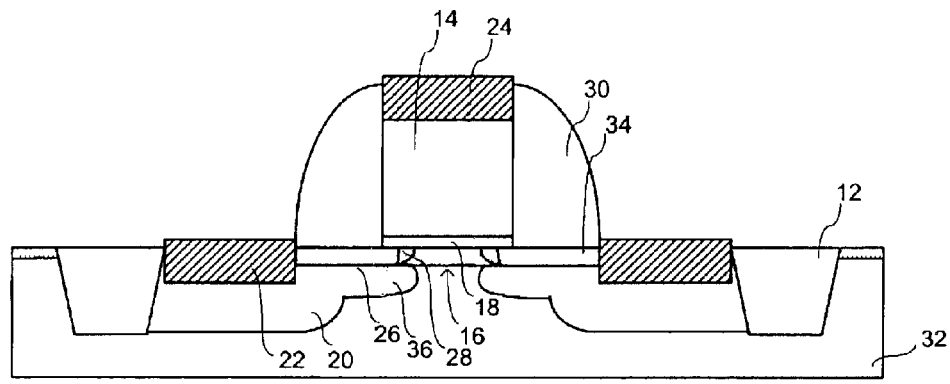
FIG. 2 shows a strained silicon NMOS device formed in accordance with the conventional processing used to form the MOSFET of FIG. 1.
Figure 3A:
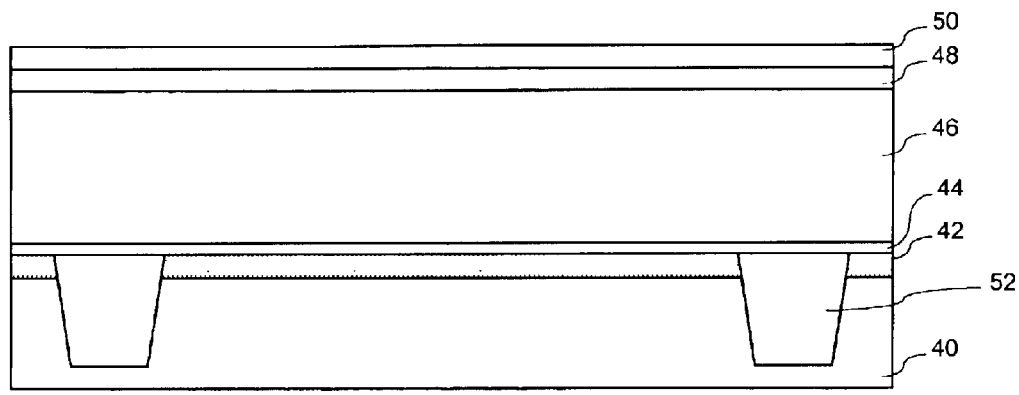
FIGS. 3a, 3b, 3c, 3d, 3e, 3f, 3g, 3h and 3i show structures formed during production of a MOSFET in accordance with a first preferred embodiment of the invention.

FIGS. 3a–3i show structures formed during fabrication of a strained silicon MOSFET in accordance with a preferred embodiment of the invention. FIG. 3a shows a structure comprising a layer of silicon germanium 40 having an epitaxial layer of strained silicon 42 formed on its surface. The silicon germanium layer 40 preferably has a composition $Si_{1-x}Ge_x$, where x is approximately 0.2, and is more generally in the range of 0.1–0.3. The silicon germanium layer 40 typically comprises a silicon germanium layer grown on a silicon wafer. Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 40 on which the strained silicon layer 42 is grown should have a uniform composition.

The strained silicon layer 42 is preferably grown by chemical vapor deposition (CVD) using $Si_2H_6$ as a source gas with a partial pressure of 30 mPa and a substrate temperature of approximately 600–900 degrees C. The strained silicon layer is preferably grown to a thickness of 200 Angstroms.

As further shown in FIG. 3a, a gate insulating layer 44 is formed on the strained silicon layer 42. The gate insulating layer 44 is typically silicon oxide but may be another material such as oxide-nitride-oxide (ONO). An oxide may be grown by thermal oxidation of the strained silicon layer, but is preferably deposited by chemical vapor deposition.

Formed over the gate insulating layer 44 is a gate conductive layer 46. The gate conductive layer 46 typically comprises polysilicon but may alternatively comprise another material such as polysilicon implanted with germanium.

Overlying the gate conductive layer 46 is a bi-layer hardmask structure comprising a bottom hardmask layer 48, also referred to as a bottom antireflective coating (BARC), and an upper hardmask layer 50. The bottom hardmask layer 48 is typically silicon oxide (e.g. $SiO_2$) and the upper hardmask layer 50 is typically silicon nitride (e.g. $Si_3N_4$).

The silicon germanium substrate also has formed therein shallow trench isolations 52. The shallow trench isolations may be formed by forming trenches having tapered sidewalls in the silicon germanium 40 and strained silicon 42 layers, performing a brief thermal oxidation, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 52 that are approximately level with the surface of the strained silicon layer 42.

Figure 3B:
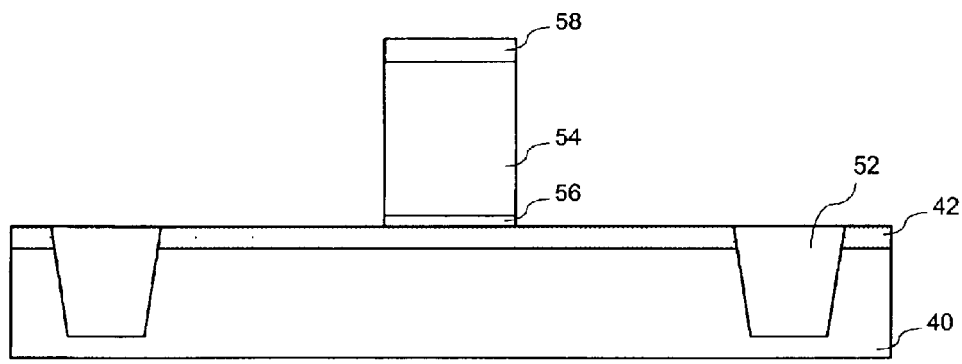

FIG. 3b shows the structure of FIG. 3a after patterning of the polysilicon layer to form a gate 54 and a self-aligned gate insulator 56. Patterning is performed using a series of anisotropic etches that patterns the upper hardmask layer using a photoresist mask as an etch mask, then patterns the lower hardmask layer using the patterned upper hardmask layer as an etch mask, then patterns the polysilicon using the patterned lower hardmask layer as an etch mask, then patterns the gate insulating layer using the gate 54 as a hardmask. As shown in FIG. 3b, the thickness of the lower hardmask layer is chosen such that after patterning of the gate insulating layer, a portion of the lower hardmask layer remains on the gate as a protective cap 58.

Figure 3C:
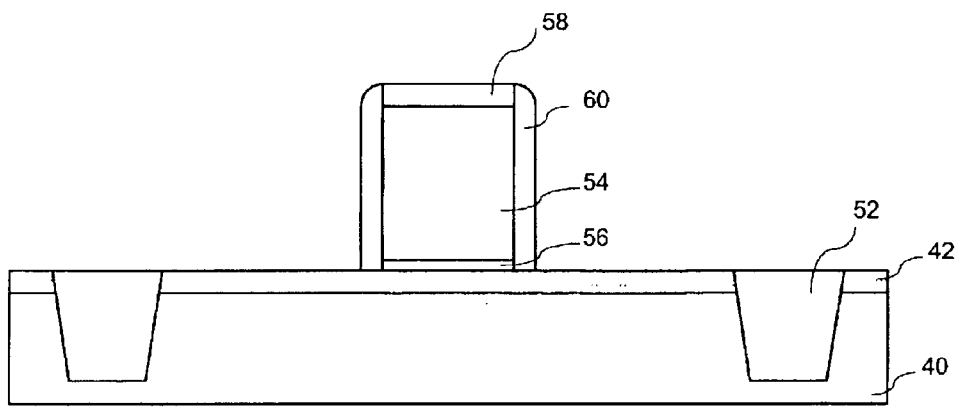

FIG. 3c shows the structure of FIG. 3b after formation of a thin first gate spacer 60 around the gate 54 and gate insulator 56. The thin first gate spacer 60 is preferably formed by deposition of a conformal layer of a protective material followed by anisotropic etching to remove the protective material from the non-vertical surfaces to leave the thin first gate spacer 60 formed around the gate 54, gate insulator 56 and protective cap 58. The thin first gate spacer 60 is preferably formed of silicon oxide or silicon nitride.

Figure 3D:
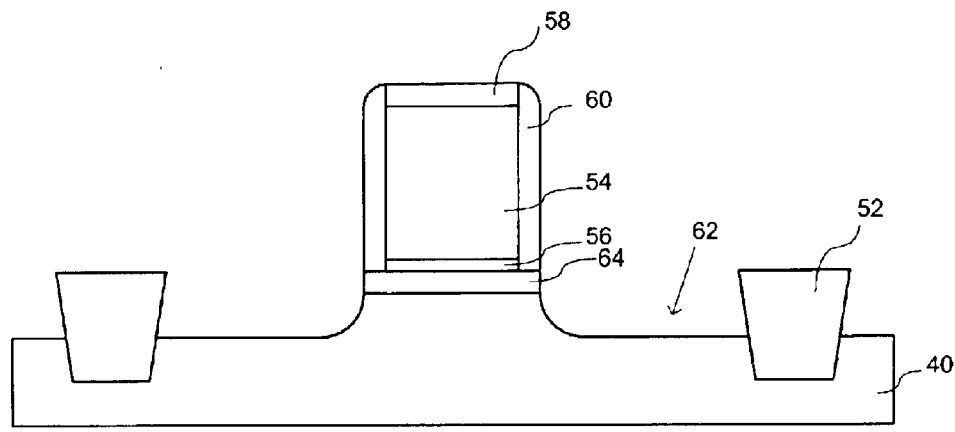

FIG. 3d shows the structure of FIG. 3c after anisotropic etching of the exposed strained silicon and silicon germanium layers to form a strained silicon channel region 64 and trenches 62 at source and drain areas on opposing sides of the strained silicon channel region 64. The etching process patterns the strained silicon channel region 64 from the strained silicon layer in a manner that is self-aligned with the gate 54 and thin first gate spacer 60.

Figure 3E:
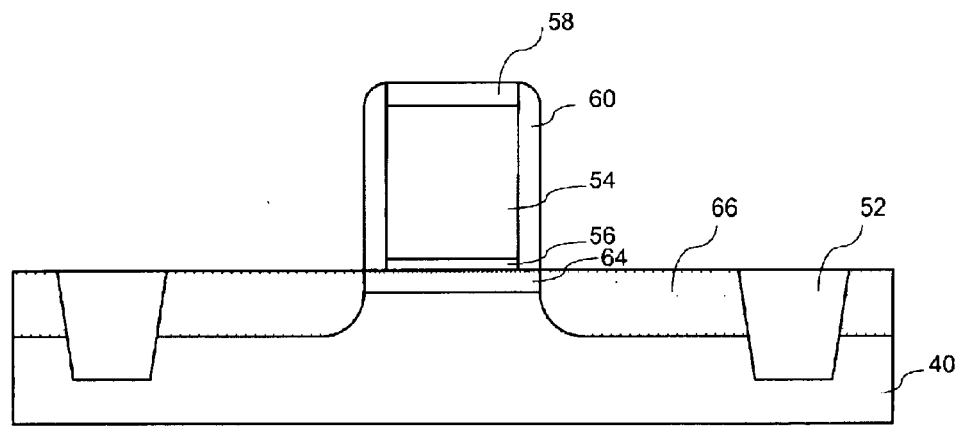

FIG. 3e shows the structure of FIG. 3d after selective growth of silicon in the trenches to form silicon regions 66 on opposing sides of the channel region 64. Preferably the selective deposition of silicon is performed in a manner that produces no silicon growth on regions other than the exposed crystalline surfaces of the silicon germanium and strained silicon. Such deposition may be performed, for example, by chemical vapor deposition using $SiBr_4$ as a source gas. Alternatively, $SiHCl_3$ may be used, or a mixture of $SiH_2Cl_2$, $SiH_4$ and HCl or $Cl_2$ may be used. As a general matter, the selectivity of the deposition process is improved by decreased pressure, increased temperature, and a decreased mole fraction of silicon in the source gas stream. The selective deposition process produces crystalline silicon growth on the exposed crystalline surfaces of the silicon germanium and strained silicon. Silicon material deposited on other surfaces such as the gate spacer 60 and shallow trench isolations 52 will be polycrystalline in form. Where selectivity cannot be precisely controlled, it may be desirable to follow selective growth of silicon with a brief exposure to an etchant that is highly selective to polysilicon so as to remove any unwanted polysilicon material from structures such as the gate spacer 60, the shallow trench isolations 52 and the gate protective cap 58.

Figure 3F:
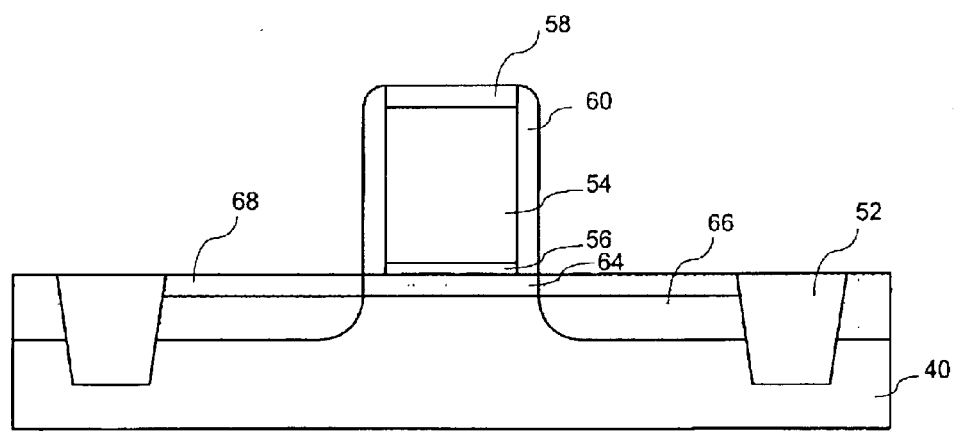

FIG. 3f shows the structure of FIG. 3e after implantation of arsenic to form shallow source and drain extensions 68 in the silicon regions 66. The source and drain extensions 68 are implanted to a depth that is less than the depth of the silicon regions 66. Halo regions (not shown) may be implanted prior to implantation of the shallow source and drain extensions. Halo regions are preferably implanted using a low energy at a small angle to the surface of the substrate so that the halo regions extend beneath the gate 54 to beyond the anticipated locations of the ends of the source and drain extensions 68 after annealing. Like the source and drain extensions 68, the halo regions are formed at opposing sides of the channel region, and extend toward the channel region beyond the ends of the source and drain extensions to be formed.

Figure 3G:
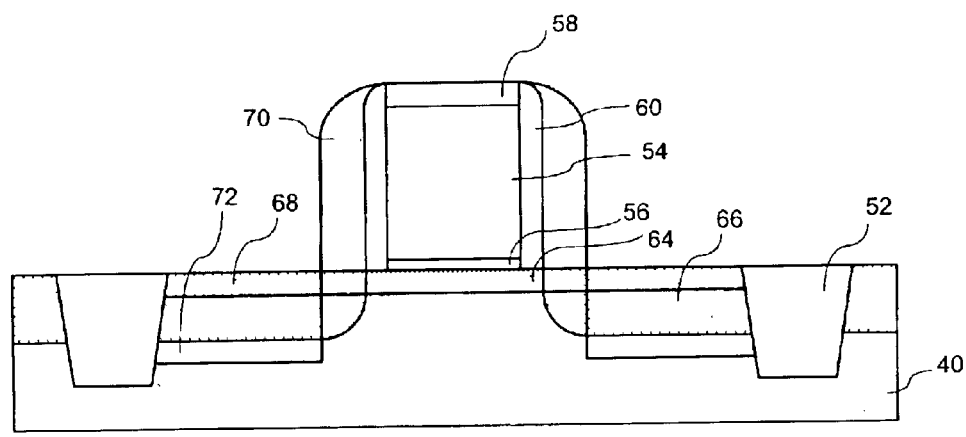

FIG. 3g shows the structure of FIG. 3f after formation of a second spacer 70 around the gate 54 and the thin first spacer 60, followed by implantation of arsenic to form deep source and drain regions 72 in the inlaid silicon regions 66. The second spacer 70 serves as an implant mask during implantation of the deep source and drain regions 72 to define the position of the source and drain regions 72 relative to the channel region 64. While the source and drain regions 72 of the structure of FIG. 3g extend beyond the depth of the inlaid silicon regions 66, in other embodiments the source and drain regions 72 may be completely contained within the inlaid silicon regions 66.

Figure 3H:
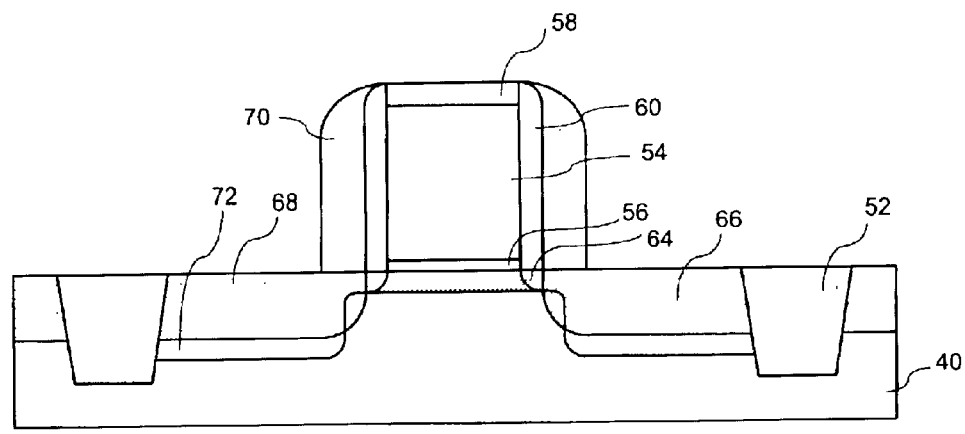

FIG. 3h shows the structure of FIG. 3g after performing rapid thermal annealing (RTA) to anneal the inlaid silicon regions 66 and silicon germanium layer 40 and to activate the dopants implanted in the shallow source and drain extensions 68 and the deep source and drain regions 72. During annealing the implanted dopants diffuse through the strained silicon channel region 64, the silicon regions 66 and the silicon germanium layer 40. However, the diffusion of the arsenic dopant of the shallow source and drain extensions 68 is contained within the silicon regions 66, and therefore the dopant does not exhibit the high rate of diffusion that would occur in silicon germanium. Therefore the problem of deep and distorted source and drain extensions is avoided.

Figure 3I:
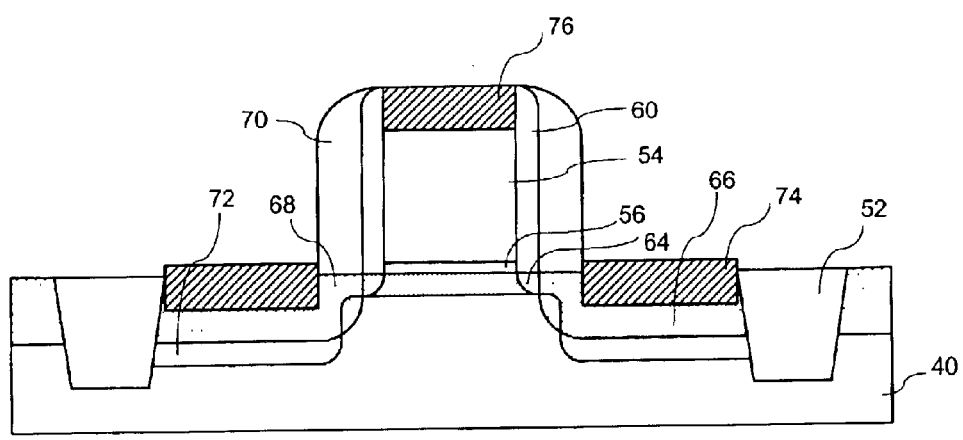

FIG. 3i shows the structure of FIG. 3h after removal of the protective gate cap 58 to expose the upper surface of the gate 54, followed by formation of silicide contacts 74 on the source and drain regions 72 and formation of a silicide contact 76 on the gate 54. The silicide contacts are formed of a compound comprised of a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials.

While the processing shown in FIGS. 3a–3i represents a presently preferred embodiment, a variety of alternatives may be implemented. For example, in one alternative embodiment, the selectively grown silicon may be doped, such as with arsenic at a dose of $1 \times 10^{19}$ to $10^{20}$ per $cm^3$. The inlaid silicon regions formed in this manner may serve as deep source and drain regions without the need for further doping. In a further alternative embodiment, another thin spacer is formed after etching of the strained silicon and silicon germanium, and prior to implanting of the shallow source and drain extensions. This spacer serves to move the shallow source and drain implant regions away from the boundary of the silicon regions so that subsequent diffusion will not introduce the dopant of the shallow source and drain extensions into the silicon germanium region.

Accordingly, a variety of embodiments in accordance with the invention may be implemented. In general terms, such embodiments include source and drain extensions formed in silicon regions that are inlaid in a silicon germanium layer and that are located on opposing sides of a strained silicon channel region. By forming the source and drain extensions in silicon regions rather than in silicon germanium, source and drain extension distortions caused by the enhanced diffusion rate of dopant in silicon germanium are avoided.

Figure 4:
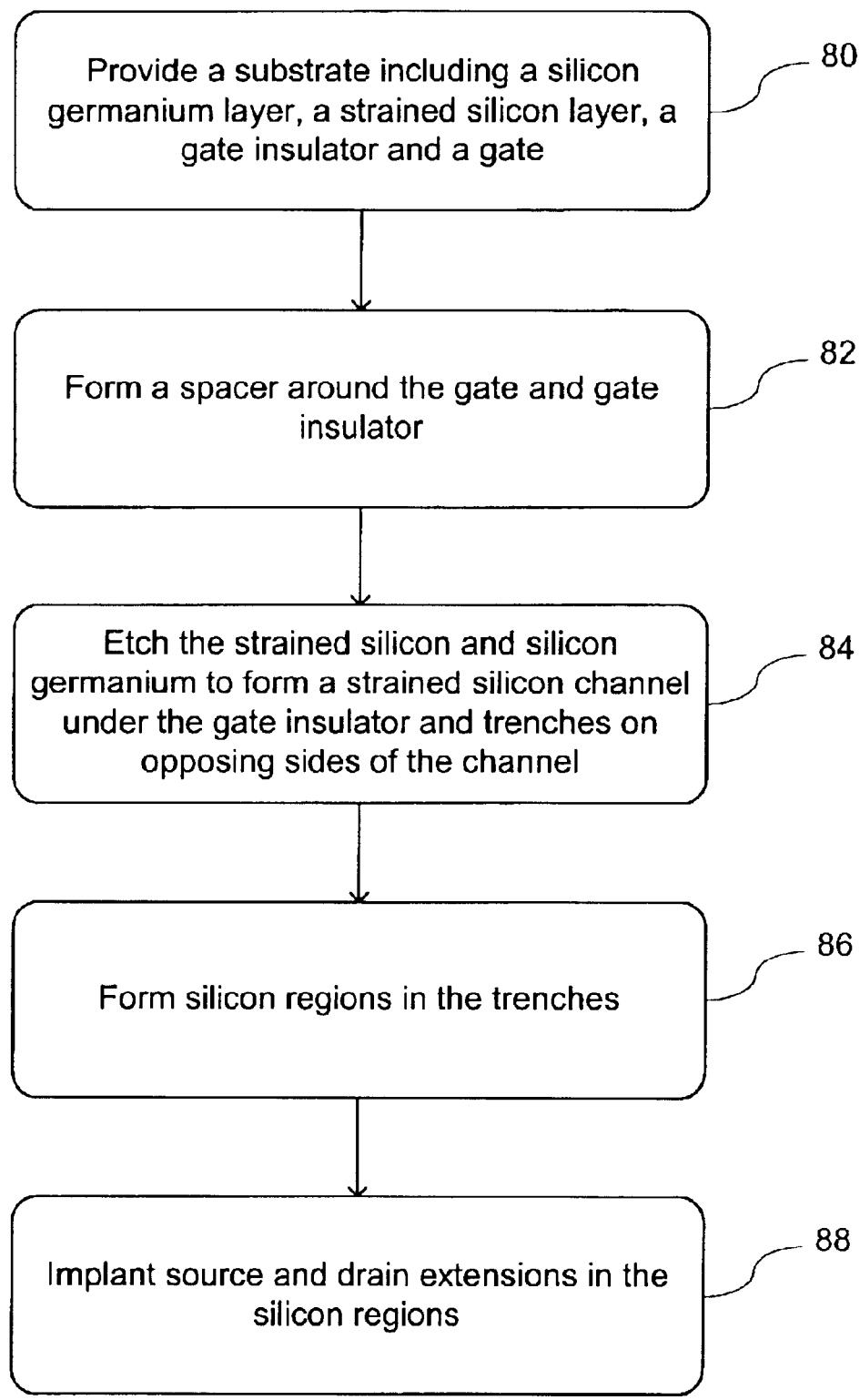
FIG. 4 shows a process flow encompassing the first preferred embodiment and alternative embodiments.

FIG. 4 shows a process flow encompassing the preferred embodiment of FIGS. 3a–3i, the aforementioned alternatives and other alternatives. Initially a substrate is provided (80). The substrate includes a layer of silicon germanium having a layer of strained silicon formed thereon. The substrate further includes a gate insulator formed on the strained silicon layer and a gate formed on the gate insulator. A first spacer is then formed around the gate and gate insulator (82). The strained silicon layer and the silicon germanium layer are then etched to form a strained silicon channel region beneath the gate insulator and to form trenches on opposing sides of the channel region (84). Silicon regions are then formed in the trenches (86), and shallow source and drain extensions are implanted in the silicon regions (88).

In further embodiments it may be desirable to further reduce n-type dopant diffusion in silicon germanium by utilizing an alternate n-type dopant such as antimony (Sb).

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. An n-type metal oxide semiconductor field effect transistor (MOSFET) device, comprising:

a substrate comprising a layer of silicon germanium;

a strained silicon channel region formed on the layer of silicon germanium;

a gate insulator formed on the strained silicon channel region;

a gate formed on the gate insulator;

silicon regions inlaid in the silicon germanium layer on opposing sides of the strained silicon channel region, the silicon regions containing substantially no germanium and extending to a depth greater than the depth of the strained silicon channel region;

deep source and drain regions formed in the silicon regions on opposing sides of the channel region; and shallow source and drain extensions formed in the silicon regions and extending from the source and drain regions toward the channel region.

2. The device claimed in claim 1, wherein the depth of the deep source and drain regions extends beyond the silicon regions into the silicon germanium layer.

3. The device claimed in claim 1, further comprising at least a first spacer formed around the gate and gate insulator.

4. The device claimed in claim 1, further comprising silicide source and drain contacts and a silicide gate contact.

5. The device claimed in claim 4, wherein the silicide source and drain contacts and the silicide gate contact comprise nickel.

6. The device claimed in claim 1, wherein the dopant of the source and drain extensions is arsenic.

7. The device claimed in claim 1, wherein the silicon germanium layer has a composition $Si_{1-x}Ge_x$, where x is in the range of 0.1 to 0.3.

8. The device claimed in claim 1, wherein the gate comprises polysilicon.

9. The device claimed in claim 1, wherein the gate insulator comprises silicon oxide.

10. The device claimed in claim 1, further comprising halo regions formed in the silicon regions at opposing sides of the channel region and extending toward the channel region beyond ends of the source and drain extensions, the halo regions comprising a dopant having a conductivity type opposite to the conductivity type of a dopant of the source and drain extensions.

* * * * *